United States Patent [19]
Kozono et al.

[11] Patent Number: 5,561,324
[45] Date of Patent: Oct. 1, 1996

[54] SEMICONDUCTOR CHIP MOUNTING SECTOR

[75] Inventors: Hiroyuki Kozono, Oomiya; Shigeki Sako, Yokohama; Hiromichi Sawaya, Kawasaki, all of Japan

[73] Assignee: Kabushiki Kaisha Toshiba, Kawasaki, Japan

[21] Appl. No.: 409,923

[22] Filed: Mar. 23, 1995

Related U.S. Application Data

[63] Continuation of Ser. No. 171,748, Dec. 22, 1993, abandoned.

[30] Foreign Application Priority Data

Dec. 24, 1992 [JP] Japan ..................... 4-343668

[51] Int. Cl.⁶ ............... H01L 23/34; H01L 23/52
[52] U.S. Cl. .............. 257/712; 257/691; 257/717; 361/713; 361/718
[58] Field of Search ................. 257/712, 717, 257/691; 361/713, 714, 717, 718

[56] References Cited

U.S. PATENT DOCUMENTS

| | | | |
|---|---|---|---|
| 4,172,261 | 10/1979 | Tsuzuki et al. | 257/717 |
| 4,688,077 | 8/1987 | Wakabayashi et al. | 257/717 |
| 4,876,588 | 10/1989 | Miyamoto | 257/717 |
| 4,901,137 | 2/1990 | Sato et al. | 257/717 |
| 4,914,551 | 4/1990 | Anschel et al. | 257/717 |
| 5,184,211 | 2/1993 | Fox | 257/717 |

FOREIGN PATENT DOCUMENTS 0427265  5/1991  European Pat. Off. ........... 257/717

*Primary Examiner*—Rolf Hille
*Assistant Examiner*—David Ostrowski
*Attorney, Agent, or Firm*—Finnegan, Henderson, Farabow, Garrett & Dunner, L.L.P.

[57] ABSTRACT

The present invention relates to a semiconductor device which comprises a semiconductor chip mounting section having a through hole, a radiating plate attached to one surface of the semiconductor chip mounting section so as to cover the through hole of the semiconductor chip mounting section, a semiconductor chip mounting plate which is formed within the through hole and mounted on the radiating plate, a surface of the semiconductor chip mounting plate, which is opposite to another surface thereof mounted on the radiating plate, being plated with gold, and the semiconductor chip mounting plate having improved electrical insulation properties and high thermal conductivity, and a semiconductor chip formed within the through hole and attached to the semiconductor chip mounting plate by a conductive adhesive.

3 Claims, 2 Drawing Sheets

SEMICONDUCTOR CHIP MOUNTING SECTOR

This application is a continuation of application Ser. No. 08/171,748, filed Dec. 22, 1993, now abandoned.

BACKGROUND OF THE INVENTION

1. Field of the Invention

The present invention relates to a semiconductor device which is so constructed that a power IC, an ECL gate array, a large scale CMOS gate array or the like is mounted on a semiconductor mounting section using a semiconductor mounting plate.

2. Description of the Related Art

In a conventional semiconductor device, as shown in FIGS. 1A and 1B, a semiconductor chip 11 on which various functional and passive devices are mounted is directly connected to a radiating plate 12-1 by a conductive adhesive 13 such as solder and paste. The radiating plate 12-1 is attached to the back of a semiconductor chip mounting section 12 so as to cover a through hole 14 formed in the semiconductor chip mounting section 12.

The purpose of directly connecting the semiconductor chip 11 to the radiating plate 12-1 is to improve in radiation characteristics.

Since the back of the semiconductor chip 11 is connected to the radiating plate 12-1, the semiconductor chip is connected to a GND pin 15 formed on the semiconductor chip mounting section 12 through a wire 14-1. A wire 14-2 is used to connect the semiconductor chip 11 to a terminal pin 15-2.

The back of the radiating plate 12-1 is generally used as a ground side. Since, however, the semiconductor chip 11 is not electrically separated from the radiating plate 12-1, the semiconductor chip 11, the radiating plate 12-1, and the GND pin 15-1 are set to the same potential when a voltage is applied to the semiconductor chip 11. Therefore, the radiating plate 12-1 has a predetermined potential with its back exposed to open air.

Further, since the semiconductor chip 11 is not electrically independent of the radiating plate 12-1, it cannot receive its proper voltage from the back thereof.

For example, if wind is given to the semiconductor chip 11 when the semiconductor device is cooled, an electrostatic potential occurs in the radiating plate 12-1, with the result that the GND potential causes a so-called fluctuation phenomenon.

SUMMARY OF THE INVENTION

An object of the present invention is to provide a semiconductor device which is so constructed that a semiconductor chip mounting plate is interposed between a semiconductor chip and a radiating plate to electrically separate them from each other.

To attain the above object, there is provided a semiconductor device comprising:

a semiconductor chip mounting section having a through hole;

a radiating plate attached to one surface of the semiconductor chip mounting section so as to cover the through hole of the semiconductor chip mounting section;

a semiconductor chip mounting plate which is formed within the through hole and mounted on the radiating plate, a surface of the semiconductor chip mounting plate, which is opposite to another surface thereof mounted on the radiating plate, being plated with gold, and the semiconductor chip mounting plate having improved electrical insulation properties and high thermal conductivity; and a semiconductor chip formed within the through hole and attached to the semiconductor chip mounting plate by a conductive adhesive.

In the semiconductor device according to the present invention, since the semiconductor chip mounting plate having improved electrical insulation properties and high thermal conductivity is interposed between the semiconductor chip and radiating plate, the semiconductor chip and radiating plate, or the semiconductor chip and semiconductor chip mounting plate are electrically separated from each other. Consequently, separate voltages are applied to an electrode of the back of the semiconductor chip and the radiating plate, thereby increasing the degree of freedom of the operation of the semiconductor device.

Furthermore, since the semiconductor chip and radiating plate are electrically separated from each other, unlike the conventional semiconductor device, no fluctuation phenomenon occurs in the voltage applied to the semiconductor chip, and a stable operation can thus be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

A semiconductor device according to an embodiment of the present invention will now be described, with reference to the accompanying drawings.

Figure 1A:
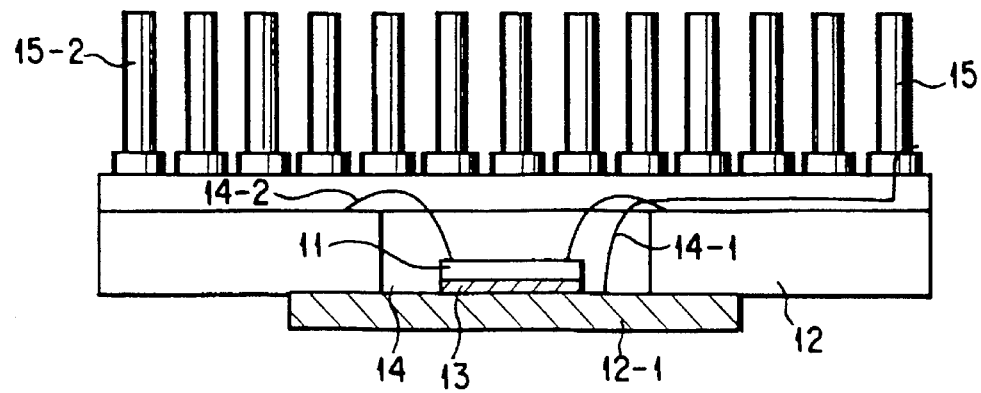
FIG. 1A is a sectional view of a conventional semiconductor device.
Figure 1B:
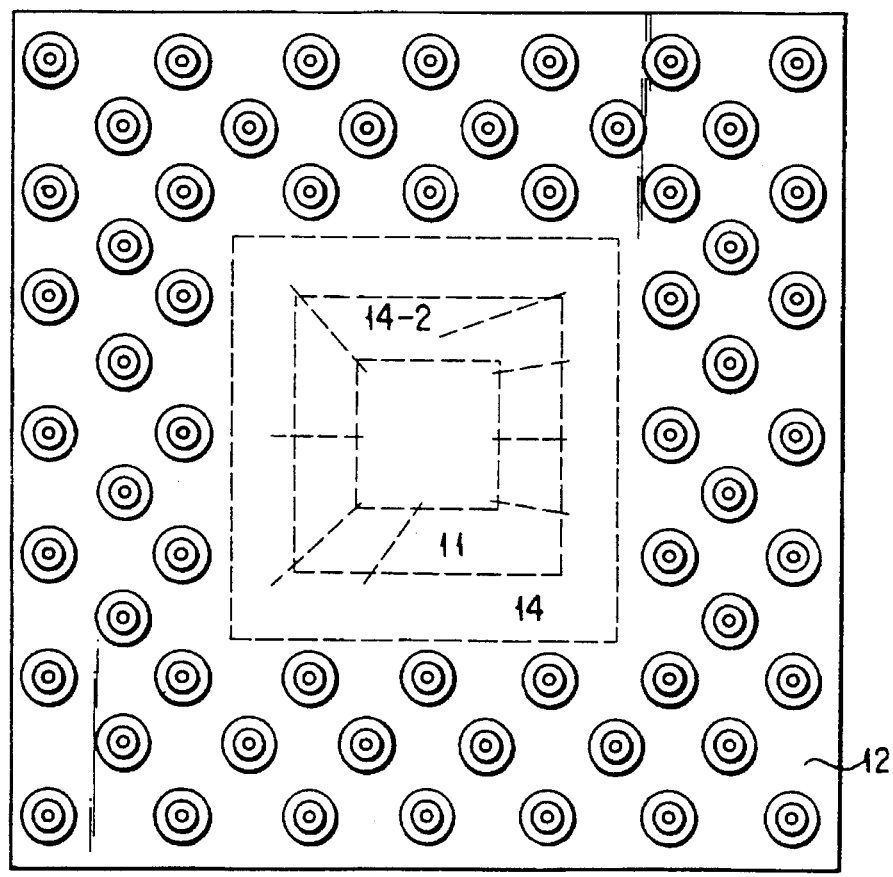
FIG. 1B is a plan view of the conventional semiconductor device shown in FIG. 1A.
Figure 2A:
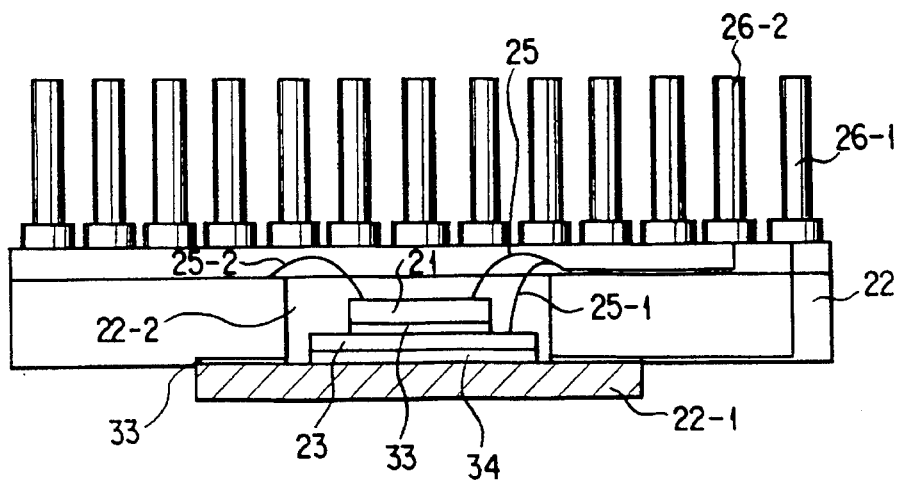
FIG. 2A is a sectional view of a semiconductor device according to the present invention.
Figure 2B:
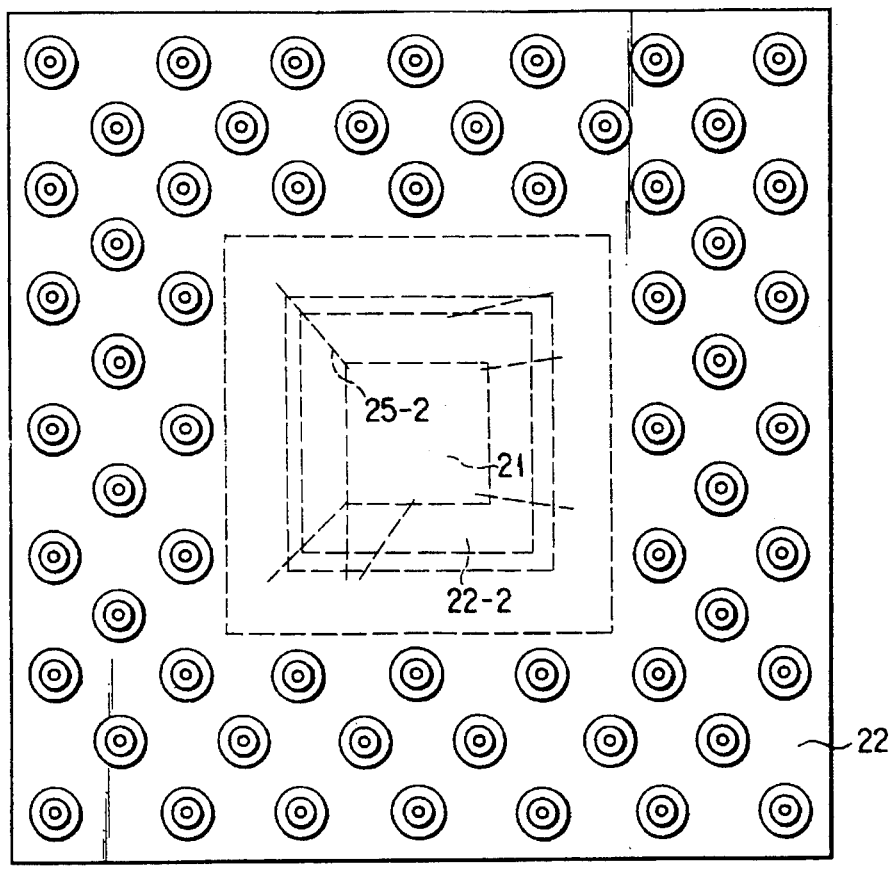
FIG. 2B is a plan view of the semiconductor device according to the present invention shown in FIG. 2A.

FIGS. 2A and 2B are sectional and plan views of the semiconductor device of the present invention, respectively. In these figures, reference numeral 22 indicates a semiconductor chip mounting section on which a plurality of pins 26-1 and 26-2 is formed; 22-1 denotes a radiating plate formed of an alloy of Cu with W and attached to the back of the semiconductor chip mounting section 22 by an adhesive 33 so as to cover a through hole 22-2 formed in the semiconductor chip mounting section 22; and 23 shows a semiconductor chip mounting plate formed of an alloy of aluminum nitride (AZN) and having high electrical insulation properties (>10 kV/mm) and high thermal conductivity (>30 W/MK). The thickness of the semiconductor chip mounting plate 23 is 0.3 mm or less to prevent its thermal resistance from decreasing to 0.1 W/° C. or less. Further, that surface of the semiconductor chip mounting plate 23 which is opposite to the mounting surface thereof, is plated with gold. Reference numeral 21 is a semiconductor chip whose back is attached to the gold-plated surface of the semiconductor chip mounting plate 23 by a conductive adhesive (paste) 33. It does not matter whether the adhesive 34 is insulative or noninsulative.

The electrode of the back of the semiconductor chip 21 is connected to the gold-plated surface of the semiconductor chip mounting plate 23 and the GND pin 26-2 serving as a power supply other than the GND pin 26-1 through a wire 25-2.

In the semiconductor device, the radiating plate 22-1 is connected to the GND pin 26-2 serving as a GND of the semiconductor device.

Since the semiconductor device of the present invention has the above structure as described above, an electrical signal system including the radiating plate 22-1, internal wiring of semiconductor chip 21, and GND pin 26-1 can be completely separated from another electrical signal system including the electrode of the back of the semiconductor chip 21, gold-plated surface of the semiconductor chip mounting plate 23, wire 25-2, and power supply GND pin 26-2.

Consequently, in the present invention, the fluctuation of potential caused when the semiconductor device is cooled does not affect the potential of the electrode of the back of the semiconductor chip 21, and the semiconductor device can be operated normally.

For example, for applying a voltage of VEE (−5V) to a device from a rear surface of a semiconductor chip, the voltage is applied to the device from a power source Pin via a bonding wire, a gilt portion of a semiconductor mount plate, and a semiconductor rear surface electrode. In this case, since the semiconductor mount plate is formed of an insulation material, a radiation plate can be electrically floated without applying the voltage to the radiation plate.

Moreover, as compared with the case in which the voltage is applied to the device from a chip surface for applying the voltage from a chip rear surface electrode, the supply at heavy-current can be performed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a semiconductor chip mounting section having a through hole;
   a radiating plate attached to one surface of said semiconductor chip mounting section so as to cover the through hole of said semiconductor chip mounting section;
   a semiconductor chip mounting plate having a thickness of no more than 3 mm and having a first surface coated with gold and a second surface coated with gold, said first surface being fixed to one surface of the radiating plate and disposed within said through hole, said semiconductor chip mounting plate being formed of a material having high electric insulating and high thermal conduction properties;
   a semiconductor chip fixed to said second surface of said semiconductor chip mounting plate by a conductive adhesive;
   means for supplying a negative potential to a first surface of said semiconductor chip; and
   means for supplying said negative potential to a second surface of said semiconductor chip through said semiconductor chip mounting plate.

2. The device according to claim 1, wherein said radiating plate includes an alloy of Cu with W.

3. The device according to claim 1, wherein said semiconductor chip mounting plate includes an alloy of aluminum nitride (AlN).

* * * * *

UNITED STATES PATENT AND TRADEMARK OFFICE
CERTIFICATE OF CORRECTION

PATENT NO. : 5,561,324
DATED : October 01, 1996
INVENTOR(S) : Hiroyuki KOZONO et al.

It is certified that error appears in the above-identified patent and that said Letters Patent is hereby corrected as shown below:

Claim 1, column 4, line 20, "3" should read --0.3--.

Signed and Sealed this

Twenty-second Day of September, 1998

Attest:

BRUCE LEHMAN

Attesting Officer          Commissioner of Patents and Trademarks